(12) United States Patent
Ballagh et al.

(10) Patent No.: US 7,383,478 B1
(45) Date of Patent: Jun. 3, 2008

(54) WIRELESS DYNAMIC BOUNDARY-SCAN TOPOLOGIES FOR FIELD

(75) Inventors: Jonathan B. Ballagh, Boulder, CO (US); Alexander Carreira, Longmont, CO (US); L. James Hwang, Menlo Park, CA (US); Roger B. Milne, Boulder, CO (US); Shay Ping Seng, San Jose, CA (US); Nabeel Shirazi, San Jose, CA (US)

(73) Assignee: Xilinx, Inc., San Jose, CA (US)

( * ) Notice: Subject to any disclaimer, the term of this patent is extended or adjusted under 35 U.S.C. 154(b) by 181 days.

(21) Appl. No.: 11/185,118

(22) Filed: Jul. 20, 2005

(51) Int. Cl.
*G01R 31/28* (2006.01)

(52) U.S. Cl. .................. 714/725; 714/727; 714/30; 714/724; 714/726; 714/729; 716/16; 716/17; 370/338

(58) Field of Classification Search ............. None
See application file for complete search history.

(56) References Cited

U.S. PATENT DOCUMENTS

| | | | | |
|---|---|---|---|---|
| 5,481,186 A * | 1/1996 | Heutmaker et al. | ...... | 324/158.1 |
| 5,864,486 A * | 1/1999 | Deming et al. | ...... | 716/17 |
| 5,887,165 A * | 3/1999 | Martel et al. | ...... | 713/100 |
| 6,412,086 B1 * | 6/2002 | Friedman et al. | ...... | 714/733 |
| 6,807,644 B2 * | 10/2004 | Reis et al. | ...... | 714/724 |
| 6,865,503 B2 * | 3/2005 | Harper et al. | ...... | 702/122 |
| 6,873,842 B2 | 3/2005 | Elayda, III et al. | | |
| 6,895,532 B2 * | 5/2005 | Raynham | ...... | 714/46 |
| 7,069,483 B2 * | 6/2006 | Gillies et al. | ...... | 714/712 |
| 7,088,288 B1 | 8/2006 | Margolese et al. | | |
| 7,142,557 B2 | 11/2006 | Dhir et al. | | |
| 7,155,647 B2 * | 12/2006 | Smith | ...... | 714/726 |
| 7,181,663 B2 * | 2/2007 | Hildebrant | ...... | 714/726 |
| 2003/0217306 A1 * | 11/2003 | Harthcock et al. | ...... | 714/30 |
| 2004/0025097 A1 * | 2/2004 | Lou | ...... | 714/726 |
| 2006/0179374 A1 * | 8/2006 | Noble | ...... | 714/727 |
| 2006/0242499 A1 * | 10/2006 | Volz | ...... | 714/724 |

OTHER PUBLICATIONS

Barr et al., End-to-End Testing for Boards and Systems Using Boundary Scan. Oct. 3-5, 2000, IEEE Test Proceedings 2000, pp. 585-592.*
U.S. Appl. No. 11/185,257, filed Jul. 20, 2005;Drimer, Saar; "Radio Frequency Identification (RFID) and Programmable Logic Device (PLD) Integration and Applications", 16 pages, available from Xilinx, Inc., 2100 Logic Drive, San Jose, CA 95124.

* cited by examiner

*Primary Examiner*—John P Trimmings
(74) *Attorney, Agent, or Firm*—W. Eric Webostad

(57) ABSTRACT

A programmable logic device (PLD) with a JTAG port, such as an FPGA, is provided with a wireless JTAG adapter to enable wireless communications. Multiple PLDs connected with wireless-to-JTAG adapters can be wirelessly linked in a network to form a large boundary-scan chain serial interface. To communicate with the PLDs having a wireless JTAG port, a host PC running application software is also equipped with a wireless transceiver.

13 Claims, 3 Drawing Sheets

WIRELESS DYNAMIC BOUNDARY-SCAN TOPOLOGIES FOR FIELD

BACKGROUND

1. Technical Field

The present invention relates to uses for a boundary-scan or Joint Test Action Group (JTAG) interface port of an integrated circuit (IC). Further, the present invention relates to wireless network communications using an IC having a JTAG interface.

2. Related Art

Today numerous protocols exist that allow multiple devices to communicate with one another over a wireless link (e.g. 802.11/Wi-Fi, Wi-Max, Bluetooth, UltraWideband (UWB), 802.15.4/ZigBee). Wireless networks blanket the country providing access to mobile phone users and users of digital devices, such as lap top computers. The trend in electronics has been to remove cables wherever possible in favor of wireless communication systems.

One communication interface that continues to use a cable instead of a wireless connection, however, is a JTAG port. A JTAG port is a four-wire interface primarily used for system testing and debugging of an integrated circuit (IC). Two defining specifications for JTAG are IEEE 1149.1 and IEEE 1532. The IEEE 1149.1 boundary-scan standard defines an interface for accessing multiple ICs that are serially interconnected on a printed circuit board.

All ICs do not include JTAG ports, but Programmable Logic Devices (PLDs), such as Field Programmable Gate Arrays (FPGAs) and Complex PLDs (CPLDs), are user programmable circuits that typically do include JTAG ports. JTAG headers can be found on most PLD development boards, providing a universal means of communicating with the PLD and other on-board devices. Other devices, such as microprocessors and Digital Signal processors (DSPs), sometimes also include JTAG ports. Because PLDs typically include a JTAG port, the JTAG interface has more recently been developed as a programming interface that provides a readily available programming link to the configuration memory of the PLD, as well as a communication link to the PLD for other purposes.

One FPGA manufacturer, Xilinx Incorporated of San Jose, Calif., provides tools that use the JTAG boundary-scan chain for functions such as testing and debugging, as well as for configuration or programming. For example ChipScope PRO uses JTAG for real-time debugging, EDK provides in-system processor debugging, System Generator for DSP (Sysgen) provides a tool available for high-level modeling and simulation, and iMPACT provides for configuration of programmable devices. These tools currently communicate to FPGA and CPLD devices via a programming cable (e.g., MultiLINX, Parallel Cable III, Parallel Cable IV). One end of the cable connects to the PLD development board and the other end connects to the host PC running application software.

Communication with an IC having a dedicated JTAG port is described with reference to the components of FIG. 1. Communication uses the JTAG interface 4 of a component 2, such as a PLD, to communicate with a host PC 6 having a JTAG communication port. Communication uses the JTAG interface components, including the Boundary Scan Chain (BSC) elements 10 and JTAG port 7 of the component 2 as a serial interface with the JTAG port of the host PC component 6. Data is provided serially between the primary Test Data Input (TDI) pin and the primary Test Data Output (TDO) pin of the JTAG access port 7. The Test Access Port (TAP) controls data flow and receives JTAG control signals from the Test Mode Select (TMS) and Test Clock (TCK) inputs.

For a single device 2, data is shifted is shifted around in the BSC elements 10 so that individual logic values appear on each of the I/O pins 12. The logic values are shifted into the component 2 using the four-wire JTAG interface 4. Data must be shifted into all input/output (I/O) pin locations 12 for every new I/O vector applied. In other words, to toggle a single output pin requires writing values and shifting them into all the I/O locations requiring a number of JTAG clock cycles to transfer a complete set of data. To monitor logic values applied to one of the I/O pins, the data can be shifted back through the JTAG boundary scan chain and out the TDO port. Data can similarly be shifted through the boundary scan of multiple ICs having JTAG ports linked or daisy chained together by cables.

For some design requirements, cables can be undesirable. Cables impose fixed structures linked with the boundary scan topology. Daisy chaining to link together the JTAG ports of multiple devices using cables is awkward as an adapter must be used to connect TDO to TDI pins between boards. Cables further restrict the physical distance between boards to the length of the cable.

SUMMARY

Embodiments of the present invention extend the debugging, configuration and co-simulation capabilities of a PLD, such as an FPGA, by using wireless technology to provide a dynamic boundary-scan topology constructed using the JTAG connection. Multiple PLDs with wireless-to-JTAG adapters forming nodes are further interconnected to form a large boundary-scan chain with wireless links.

To provide wireless communication using a JTAG port, a PLD with a JTAG port is connected to a circuit board with a wireless-to-JTAG adapter that enables wireless data to be shifted through the circuit board's boundary-scan chain, much in the same way data currently is read from and written to a boundary-scan chain using a programming cable. The JTAG adapter includes a small board containing a ribbon cable, adapter logic, wireless transceiver, and power supply. One end of the ribbon cable plugs into a JTAG header on the PLD circuit board. The other end connects to logic that interfaces to a wireless transceiver. The logic is responsible for sending/receiving packets across the wireless link and translating them into appropriate JTAG commands.

To communicate with the PLD having a wireless JTAG port, a host PC running application software is also equipped with a wireless transceiver. In this manner, the host PC may establish wireless links to JTAG wireless adapter equipped circuit boards. Further, multiple PLDs having wireless JTAG adapters can be configured as nodes in a network to communicate with each other, or with a host PC node in the network.

To set up a network, the wireless JTAG adapters may "discover" the boundary-scan topology through nearest neighbor communication, or may rely on the host PC node in the network to build the topology. A network can be set up by a user with high level modeling application software on the host PC. In one network boundary-scan topology, PLDs with wireless JTAG adapters communicate directly with each other in a chain with the PC host node forming a link in the chain. In another network the PLDs with wireless JTAG adapters communicate only through the host PC, with the host PC relaying signals from one PLD to the next to form the boundary scan chain. In either scenario, boundary-scan chain TDO-TDI links are established between one or more nodes in the chain. New boards can be added to the scan chain simply by bringing the board within the vicinity of another board (or host PC) so that it is discovered.

From the perspective of a device residing on a circuit board, all devices present on the virtual boundary-scan chain are accessible through the traditional boundary-scan serial interface. This means that devices can communicate with one another simply by shifting bits across the virtual chain. The ability to shift data serially to multiple devices is particularly useful for hardware co-simulation, where multiple PLD devices may be co-simulated concurrently. By supporting wireless JTAG, the host PC has access to any PLD device present in a given node.

BRIEF DESCRIPTION OF THE DRAWINGS

Further details of the present invention are explained with the help of the attached drawings in which.

DETAILED DESCRIPTION

Figure 2:
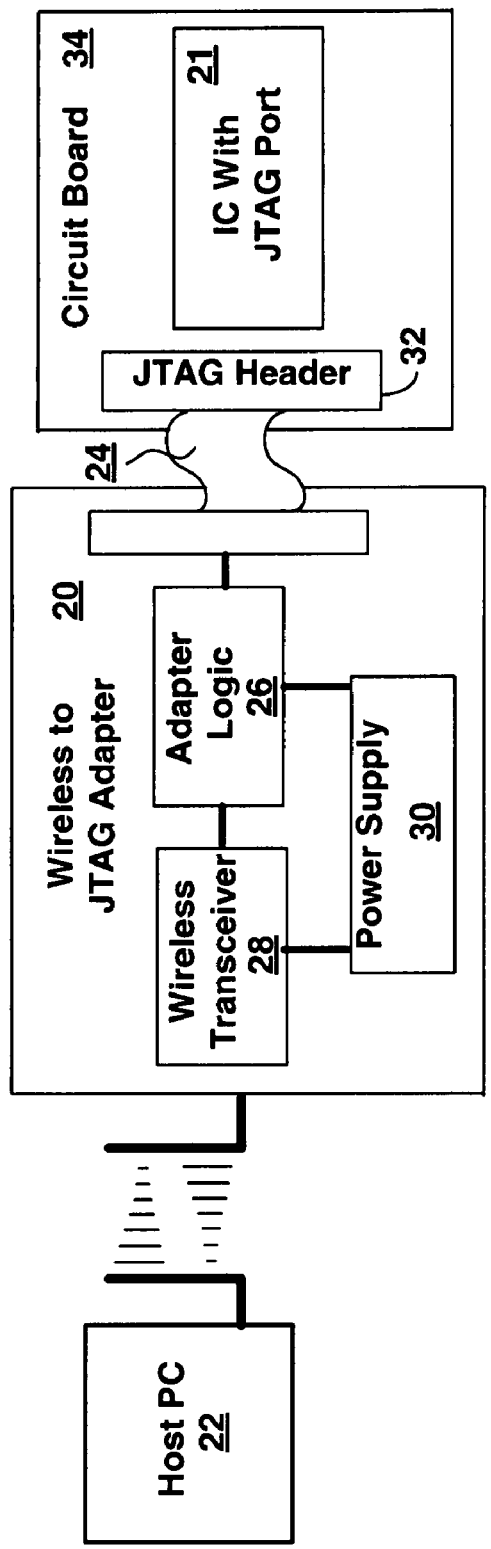
FIG. 2 illustrates circuitry for a wireless-to-JTAG adapter for interconnecting an IC with a JTAG interface to a host PC.

FIG. 2 illustrates circuitry for a wireless-to-JTAG adapter 20 for interconnecting an IC 21 with a JTAG interface to a host PC 22. The JTAG adapter 20 is provided on a small circuit board containing a ribbon cable 24, adapter logic 26, a wireless transceiver 28, and power supply 30. One end of the ribbon cable 24 plugs into a JTAG header 32 on a circuit board 34 containing an IC 21 with a JTAG interface, such as a PLD, a DSP, etc. A second end of the ribbon cable 24 connects to the adapter logic 26 that interfaces to a wireless transceiver 28. The wireless transceiver provides for wireless communication with the host PC 22, wireless communication being compliant with any one of numerous protocols (e.g., Bluetooth, ZigBee, UWB). This adapter logic 26 is responsible for sending/receiving packets across the wireless link and translating them into appropriate JTAG commands that enable communication with the IC 21 having a JTAG interface.

Although the JTAG adapter 20 is shown to be on a separate board from the IC 21 containing a JTAG interface, in one embodiment, all components of the JTAG adapter 20 are provided on the circuit board 34 with the IC 21 containing a JTAG interface. With components on a single board communicating wirelessly with the host PC 22, in a further embodiment, the ribbon cable 24 is replaced by traces provided in the circuit board. In further embodiments, different type connectors than the ribbon cable 24 can be used to interface the IC 21 with the adapter logic 26. In an alternative embodiment the wireless to JTAG Adapter 20 and IC 21 are on the same board. In yet a further embodiment the wireless to JTAG Adapter 20 and IC 21 are on the same semiconductor substrate in either a multi-chip module or in the same integrated circuit.

Figure 1:
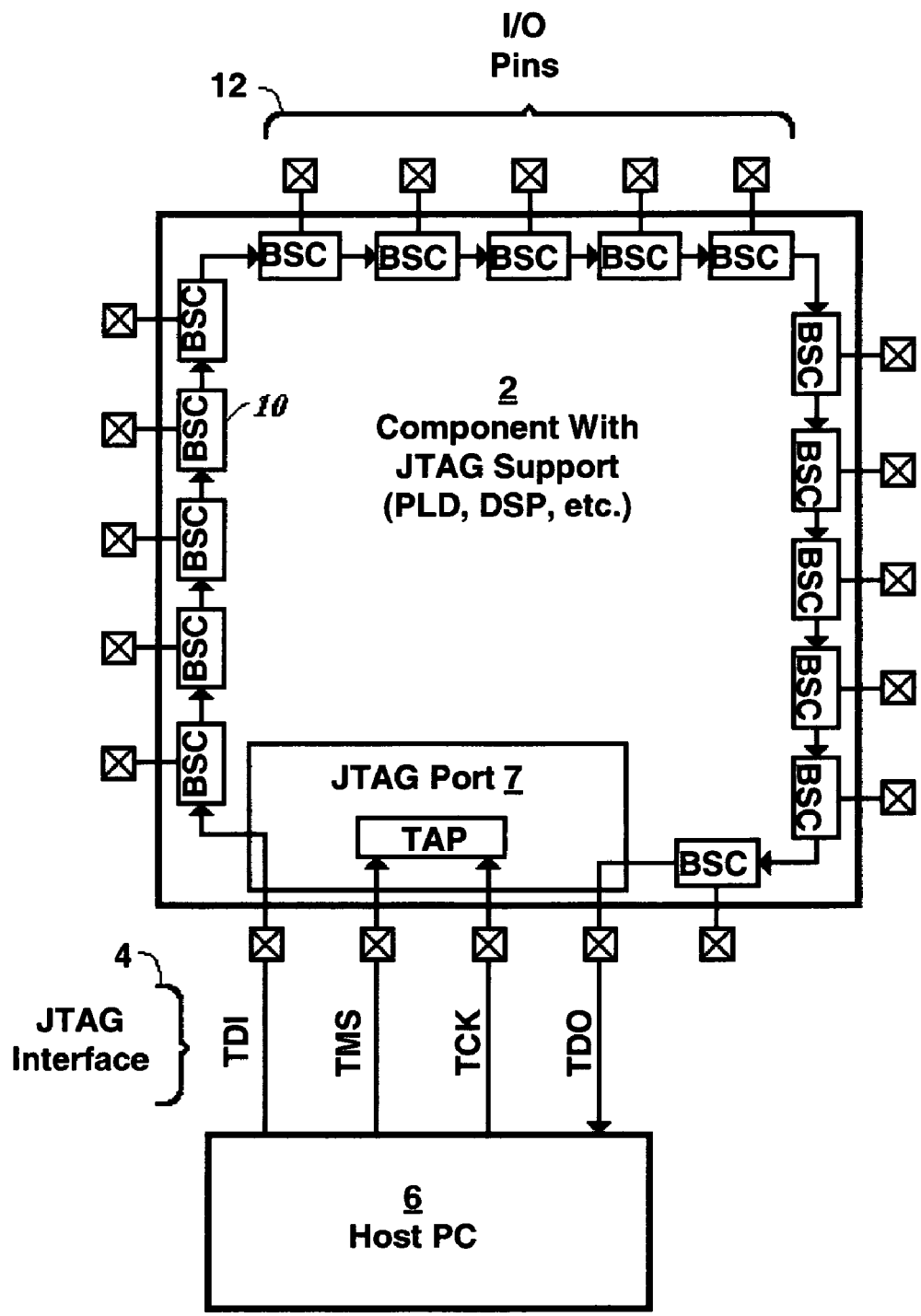
FIG. 1 shows a block diagram of internal components of an IC with a JTAG interface and its connection to a host PC.

The wireless-to-JTAG adapter enables wireless data to be shifted through the circuit board's boundary-scan chain, much in the same way data currently is read from and written to the chain using a programming cable. The boundary scan chain can be in a single IC, as shown in FIG. 1, or multiple ICs with JTAG ports interconnected. In addition to the obvious benefit of being able to talk to the IC with a JTAG interface without the encumbrance of interlinking physical cables, the solution is made more attractive by the fact that wireless technology is inexpensive and small in size. The wireless-to-JTAG adapter can be retrofitted to different existing JTAG headers available currently an existing circuit boards.

Figure 3:
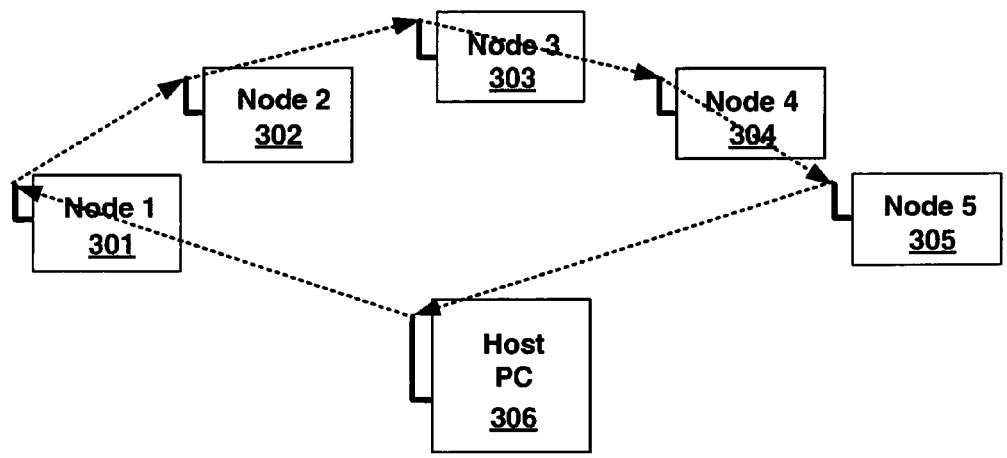
FIG. 3 shows a network with nodes formed by ICs having wireless-to-JTAG adapters as well as a host PC node, the nodes being configured to form an actual boundary-scan chain.
Figure 4:
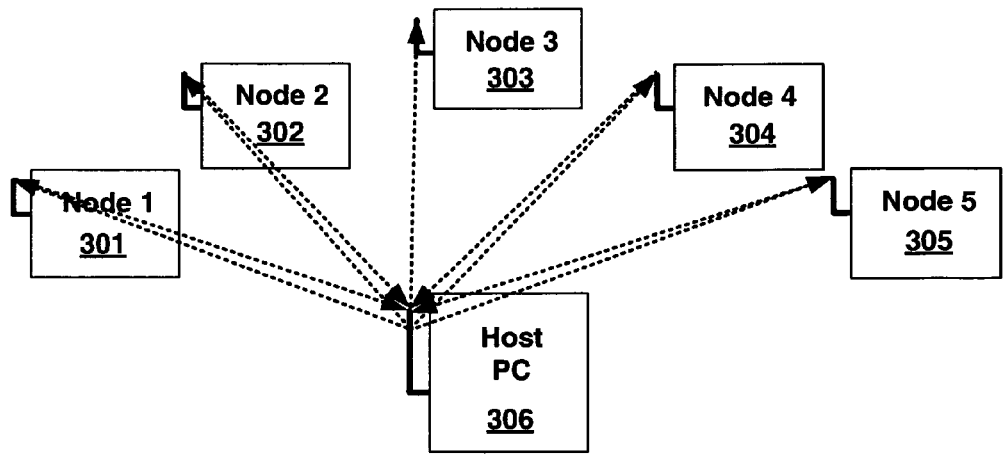
FIG. 4 shows a network with nodes formed by ICs having wireless-to-JTAG adapters as well as a host PC node, the nodes being configured to form a virtual boundary-scan chain.

In further embodiments of the present invention, a network is constructed between multiple nodes having wireless-to-JTAG adapters. The nodes are assembled to allow wireless communication between JTAG ports to form a dynamic boundary-scan chain topology. To control the network, an additional host PC node running application software is also equipped with a wireless transceiver, similar to the arrangement of FIG. 2. Two configurations for networks to provide a boundary-scan chain are shown in FIGS. 3 and 4.

To initially set up a network with the boundary-scan chain, links between the nodes can be established using the nodes themselves, or with the assistance of the application software of the host PC node. The wireless JTAG adapters may "discover" the boundary-scan topology through nearest neighbor communication, or may rely on the host PC to build the topology. In either scenario, virtual boundary-scan chain TDO-TDI links are established between one or more nodes in the chain. New boards can be added to the scan chain simply by bringing the board within the vicinity of another board (or host PC) so that it is discovered. Note that physically adjacent nodes need not be neighbors in the virtual boundary-scan chain.

In one embodiment of this invention, users can control how the scan chain is constructed using graphical application software on the host PC. For example, high level modeling software such as the Simulink graphical environment from MathWorks, Inc. allows designs to be constructed using blocks and wires that define connections between blocks. Using high-level models, users can create graphical block-based representations of each node in this environment. Wires between nodes can be added and deleted by users, explicitly defining the serial scan chain connections in the process. It is also possible to display characteristics about each node on their graphical block counterparts, including reliability, delay, and internal boundary-scan chain device information.

Apart from the application software of the host PC node, the JTAG/wireless adapter nodes can have varying degrees of built in intelligence, allowing them to resolve various conditions that may arise on the network. For example, a user could configure the nodes with certain reliability and speed requirements. It is possible to filter or arrange nodes based on the devices present in their boundary-scan chain. The adapters may also be capable of determining the shortest path route from one node to another to assist in setup and linking of nodes. Eliminating the interconnecting wires or cables allows these topologies to be constructed dynamically at run-time.

FIG. 3 shows a network with nodes 301-305 formed from ICs having wireless-to-JTAG adapters as well as a host PC node 306, the nodes being configured to form an actual boundary-scan chain. Communication in the network takes place with data transferred sequentially from one node to an adjacent node around the chain, such as from node 301 to node 302 to node 303, etc. Within a node, data is transferred through the JTAG TDI port and around the BSCs (as illustrated in FIG. 1) to the TDO port before being transferred to the next network node. The network, thus provides a large actual boundary-scan chain with wireless links. A similar prior art JTAG boundary-scan chain without wireless links is typically formed on a circuit board with ICs having JTAG ports interconnected by traces on the PC board, rather than through wireless connections. Accordingly, communication of data using the system illustrated in FIG. 3 can be done using a similar JTAG application software without requiring further development.

FIG. 4 shows an alternative network configuration with nodes 301-305 and host PC node 306 communicating in a manner to form a virtual boundary-scan chain. In FIG. 4 signals transferred between individual nodes 301-305 are relayed through the PC node 306, rather than directly between adjacent nodes 301-305. Accordingly, as an example, data from node 301 to be transferred around the virtual boundary-scan chain is transmitted wirelessly from the JTAG TDO port of node 301 to the PC node 306, and then from the PC node 306 to the JTAG TDI port of node 302, around its BSCs, and then from the TDO port of node 302 back to the PC node 406, etc.

In the virtual boundary-scan chain of FIG. 4, from the perspective of one of the nodes 301-305, all of nodes 301-305 present on the virtual boundary-scan chain are accessible through the traditional boundary-scan serial interface. This means that devices may communicate with one another simply by shifting bits across the virtual chain. It is the responsibility of the wireless adapter nodes or host PC to ensure the bits are routed to the appropriate node to mimic the serial transfer. Note that for a given circuit board or node, the arrangement of internal boundary-scan devices remain fixed. The ability to shift data serially to multiple devices is particularly useful for hardware co-simulation, where multiple ICs with wireless-to-JTAG ports may be co-simulated concurrently. By supporting wireless JTAG, the host PC also has access to any given node present.

Although the present invention has been described above with particularity, this was merely to teach one of ordinary skill in the art how to make and use the invention. Many additional modifications will fall within the scope of the invention, as that scope is defined by the following claims.

What is claimed is:

1. A wireless communication system comprising:
   a first subsystem and a second subsystem of the wireless communication system;
   the first subsystem including a first Programmable Logic Device (PLD) having a first boundary scan port and a first wireless communication adapter coupled to the first boundary scan port of the first PLD for communication therebetween;
   the second subsystem including a second PLD having a second boundary scan port and a second wireless communication adapter coupled to the second boundary scan port of the second PLD for communication therebetween;
   the first wireless communication adapter including a first transceiver for communicating with a host computer over a first wireless link;
   the second wireless communication adapter including a second transceiver for communicating with the host computer over a second wireless link;
   first configuration memory of the first PLD capable of being remotely configured responsive to configuration information provided from the host computer;
   the configuration information capable of being provided from the host computer via the first wireless link for the first wireless communication adapter for the first PLD via the first boundary scan port; and
   the first PLD, the second PLD, and the host computer forming a virtual boundary scan chain using at least the first wireless link and the second wireless link.

2. The wireless communication system according to claim 1, further comprising:
   second configuration memory of the second PLD capable of being remotely configured responsive to the configuration information being provided from the host computer; and
   the configuration information capable of being provided from the host computer via the second wireless link for the second wireless communication adapter for the second PLD via the second boundary scan port; and
   the configuration information is for co-simulation of the first PLD and the second PLD.

3. The wireless communication system according to claim 2, wherein:
   input test data is provided to the first PLD and the second PLD via the first wireless communication link and the second wireless communication link, respectively, for the first wireless communication adapter and the second wireless communication adapter, respectively, for the first boundary scan port and the second boundary scan port, respectively; and
   first output test data and second output test data responsive to the input test data is obtained by the host computer respectively from the first boundary scan port and the second boundary scan port via the first wireless communication adapter and the second wireless communication adapter, respectively, via the first wireless communication link and the second wireless communication link, respectively.

4. The wireless communication system according to claim 3, wherein:
   the input test data is serially bit shifted into the first boundary scan port and the second boundary scan port, respectively, for the co-simulation;
   the first output test data and the second output test data are serially bit shifted out of the first boundary scan port and the second boundary scan port, respectively, for the co-simulation;
   the first boundary scan port and the second boundary scan port are a first JTAG interface and a second JTAG interface, respectively;
   the first JTAG interface includes a first Test Access Port for serially shifting of the input test data and the first output test data; and
   the second JTAG interface includes a second Test Access Port for serially shifting of the input test data and the second output test data.

5. The wireless communication system according to claim 4, wherein the first wireless communication adapter and the second wireless communication adapter are each capable of translating from a JTAG format to a packet format for communication via the first wireless link and the second wireless link, respectively.

6. The wireless communication system according to claim 5, wherein the first wireless communication adapter and the second wireless communication adapter are each capable of translating from the packet format to the JTAG format for communication via the first boundary scan port of the first PLD and the second boundary scan port of the second PLD, respectively.

7. The wireless communication system according to claim 6, wherein the packet format is consistent with any one protocol selected from a group consisting of Bluetooth, ZigBee and UWB.

8. The wireless communication system according to claim 4, wherein topology of the virtual boundary scan chain is associated with topology of a network of the wireless communication system.

9. The wireless communication system according to claim 8, wherein the topology of the network is dynamically constructed at run-time.

10. The wireless communication system according to claim 8, wherein the topology of the network is dynamically constructed at run-time using through nearest neighbor communication.

11. The wireless communication system according to claim 8, wherein the topology of the network is dynamically constructed to allow for addition of one or more other subsequent subsystems.

12. The wireless communication system according to claim 11, wherein the topology of the network is a plurality of networked nodes organized as a communication ring, the host computer, the first subsystem, the second subsystem and the one or more other subsequent subsystems organized for sequential transfer of data from networked node-to-networked node around the communication ring.

13. The wireless communication system according to claim 8, wherein the topology of the network is constructed from the host computer.

* * * * *